(12) United States Patent
Bal et al.

(10) Patent No.: US 11,177,799 B2
(45) Date of Patent: Nov. 16, 2021

(54) DEBOUNCE CIRCUIT WITH NOISE IMMUNITY AND GLITCH EVENT TRACKING

(71) Applicant: STMicroelectronics International N.V., Geneva (CH)

(72) Inventors: Ankur Bal, Greater Noida (IN); Vikas Chelani, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/029,631

(22) Filed: Sep. 23, 2020

(65) Prior Publication Data

US 2021/0119621 A1   Apr. 22, 2021

Related U.S. Application Data

(60) Provisional application No. 62/923,202, filed on Oct. 18, 2019.

(51) Int. Cl.
| | |
|---|---|
| *H03K 5/1252* | (2006.01) |
| *H03K 19/003* | (2006.01) |
| *H03K 17/16* | (2006.01) |

(52) U.S. Cl.
CPC .......... *H03K 5/1252* (2013.01); *H03K 17/16* (2013.01); *H03K 17/162* (2013.01); *H03K 19/00346* (2013.01)

(58) Field of Classification Search
CPC .......... H03K 5/1252; H03K 19/00346; H03K 19/00361; H03K 17/16; H03K 17/161; H03K 17/162
See application file for complete search history.

(56) References Cited

U.S. PATENT DOCUMENTS

| | | |
|---|---|---|
| 4,549,094 A | 10/1985 | Floyd |
| 5,386,159 A | 1/1995 | Dupré |
| 6,559,679 B2 | 5/2003 | Kim |
| 7,579,894 B2 | 8/2009 | Kejriwal |
| 8,502,593 B2 | 8/2013 | Lu et al. |
| 8,558,579 B2 * | 10/2013 | Zhang .................. H03K 5/1252 327/31 |
| 8,558,606 B2 | 10/2013 | Chen |
| 8,803,554 B2 | 8/2014 | Langadi |
| 9,484,899 B2 | 11/2016 | Todd |

* cited by examiner

*Primary Examiner* — Jung Kim
(74) *Attorney, Agent, or Firm* — Seed IP Law Group LLP (57) ABSTRACT

A debounce circuit and a method for masking or filtering a glitch from an input signal are provided. The debounce circuit includes a reset synchronizer circuit and a logic circuit. The reset synchronizer circuit receives the input signal, detects a glitch in the input signal and outputs one or more reset synchronizer output signals having a first reset synchronizer state indicating detection of the glitch. The logic circuit receives the one or more reset synchronizer output signals, determines that the one or more reset synchronizer output signals are in the first reset synchronizer state indicating detection of the glitch and in response to determining that the one or more reset synchronizer output signals are in the first reset synchronizer state, keeps an output signal of the debounce circuit in a present state of the output signal of the debounce circuit.

22 Claims, 5 Drawing Sheets

DEBOUNCE CIRCUIT WITH NOISE IMMUNITY AND GLITCH EVENT TRACKING

BACKGROUND

Technical Field

This application is directed to a debounce circuit that mitigates and masks a glitch.

Description of the Related Art

In microcontrollers and system-on-chip (SoC) applications, among other applications, tracks and wires as well as signals that traverse them are susceptible to external and ambient electrical noise. The noise can corrupt the signals, which may be asynchronous control signals, and introduce errors in the signals. The noise may introduce errors in the signals intermittently.

In electronic devices, glitches may occur, whereby an electronic signal changes its level due to noise or interference. For example, a signal that is a logical one (active, asserted or high) may temporarily become a logical zero (inactive, deasserted or low).

BRIEF SUMMARY

Provided herein is a debounce circuit that filters, masks or mitigates glitches in an electronic signal. The debounce circuit receives the signal and outputs an output signal having the glitches filtered, masked or mitigated. The debounce circuit includes a reset synchronizer circuit that receives the signal and detects whether the signal has a glitch. When the signal has the glitch, the reset synchronizer circuit outputs reset synchronizer output signals having a first state indicating the presence of the glitch. The debounce circuit includes logic that receives the reset synchronizer output signals and determines based on the reset synchronizer output signals that the glitch is present in the signal. In response, the logic keeps the output signal in its present state thereby preventing the glitch from influencing the output signal.

When the signal does not have a glitch, the reset synchronizer circuit outputs reset synchronizer output signals having either a second state or a third state corresponding to a state of the signal. If the signal is a logical zero and the glitch is not detected, the reset synchronizer output signals have the second state indicating that the signal is a logical zero and the glitch is not detected. If the signal is a logical one and the glitch is not detected, the reset synchronizer output signals have the third state indicating that the signal is a logical one and the glitch is not detected.

The logic receives the reset synchronizer output signals. When the reset synchronizer output signals are either in the second state or third state, the logic determines that the glitch is not detected. Further, the state of the input signal may be gleaned from the state of the reset synchronizer output signals. That is, when the reset synchronizer output signals are in the second state, the logic determines that the signal is a logical zero and the logic sets the output signal to a logical zero. When the reset synchronizer output signals are in the third state, the logic determines that the signal is a logical one and the logic sets the output signal to a logical one.

Accordingly, the debounce circuit operates to detect and mask the glitch in the event that the glitch is detected. The debounce circuit operates to pass the signal to the output without modification when the glitch is not detected.

DETAILED DESCRIPTION

Figure 1:
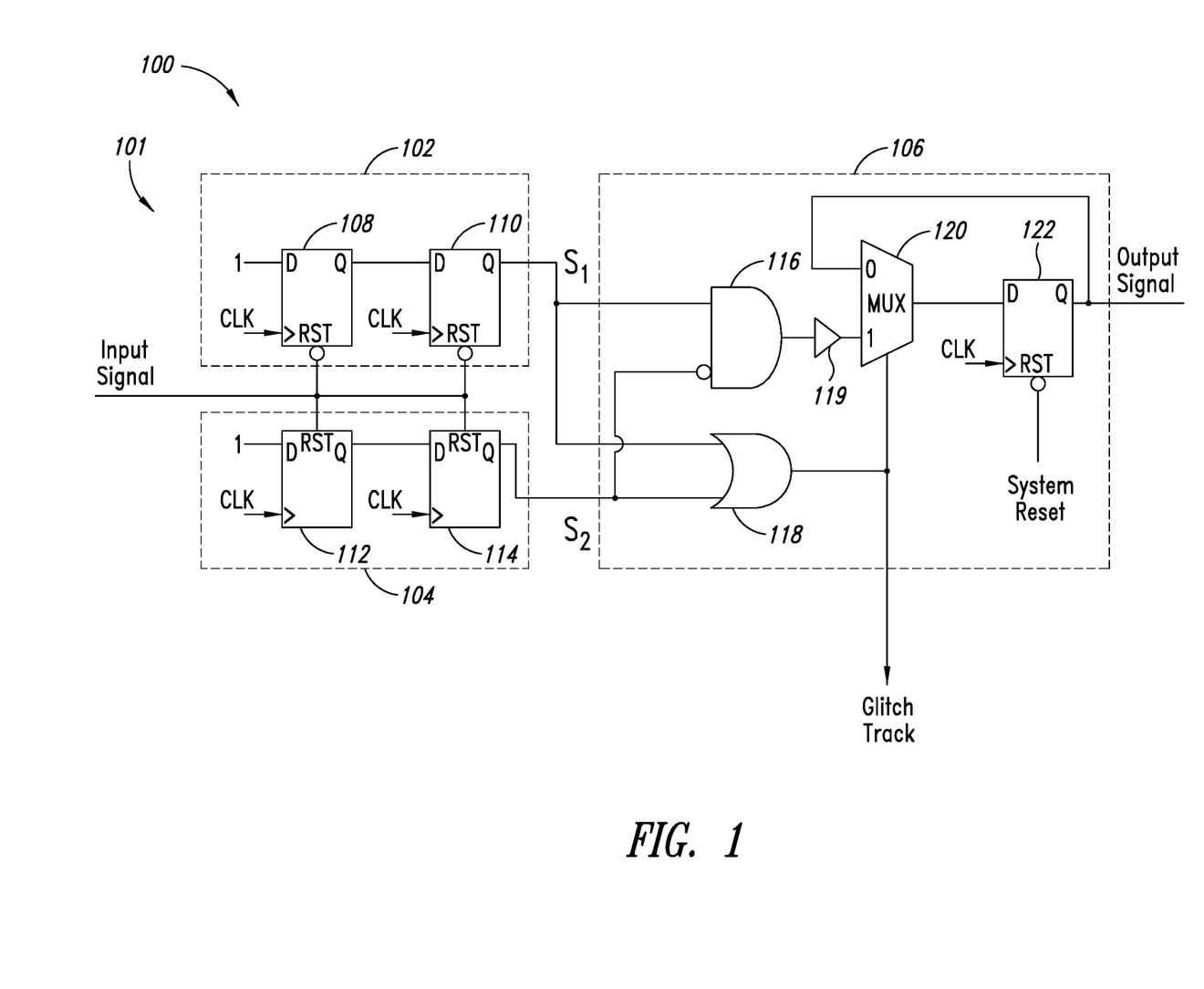
FIG. 1 shows a schematic of a debounce circuit.

FIG. 1 shows a schematic of a debounce circuit 100. The debounce circuit 100 includes a reset synchronizer circuit 101 and logic circuit 106. The reset synchronizer circuit 101 includes a first reset synchronizer 102 and a second reset synchronizer 104. The first reset synchronizer 102 includes a first latch 108 and a second latch 110. The first and second latches 108, 110 may each be a set-reset (SR) flip-flop or a delay (D) flip-flop, among others. The second reset synchronizer 104 includes a third latch 112 and a fourth latch 114, which may each be an SR flip-flop or D flip-flop, among others.

The logic circuit 106 includes an AND gate 116, an OR gate 118, a buffer 119, a multiplexer 120 and an output latch 122. The AND gate 116 may be any type of logical conjunction digital device and the OR gate 118 may be any type of logical disjunction digital device. The buffer 119 may be any type of delay element operative to delay a transit of a signal. The multiplexer 120 may be any type of input selection device and the output latch 122 may be an SR flip-flop or D flip-flop, among others.

In the first reset synchronizer 102, the first and second latches 108, 110 each have a data input D, a clock input>, a data output Q, and a reset input RST. The data output of the first latch 108 is coupled to the data input of the second latch 110. A data output of the first reset synchronizer 102 is taken at the data output of the second latch 110.

In the second reset synchronizer 104, the third and fourth latches 112, 114 each have a data input D, a clock input>, a data output Q, and a reset input RST. The data output of the first latch 112 is coupled to the data input of the second latch 114. A data output of the second reset synchronizer 104 is taken at the data output of the second latch 114.

The AND gate 116 has a first input (that is a noninverting input) coupled to the output of the first synchronizer 102. The AND gate 116 has a second input (that is an inverting input) coupled to the output of the second reset synchronizer 104. The AND gate 116 also has an output. The OR gate 118 has a first input coupled to the output of the first reset synchronizer 102 and a second input coupled to the output of the second reset synchronizer 104. The OR gate 118 also has an output. The buffer 119 has an input coupled to the output of the AND gate 116 and the buffer 119 has an output.

The multiplexer 120 has a first data input, a second data input, a selection input and an output. The second data input of the multiplexer 120 is coupled to the output of the buffer 119. The selection input of the multiplexer 120 is coupled to the output of the OR gate 118.

The output latch 122 has a data input D, a clock input>, a reset input RST, and a data output Q. The data input of the output latch 122 is coupled to the data output of the multiplexer 120. The data output of the output latch 122 is coupled to the first data input of the multiplexer 120. The data output of the output latch 122 provides an output signal of the debounce circuit 100. The reset input of the output latch 122, which is an inverting input, is configured to receive a system reset signal that resets the debounce circuit 100 when inactive (or a logical zero). The system reset signal may be received from a controller of the debounce circuit 100, a device that provides an input to the debounce circuit 100 or a device that receives an output of the debounce circuit 100.

A clock signal (denoted 'CLK') is supplied to the clock inputs of the latches 108, 110, 112, 114, 122. The clock signal, thus, sets the timing operation of the debounce circuit 100. The elements of the debounce circuit 100 are driven by the same clock signal. The latches 108, 110, 112, 114 are clocked or synchronous and may be edge-triggered. Although the latches 108, 110, 112, 114 are described herein as being rising edge-triggered, the latches 108, 110, 112, 114 may be otherwise triggered, such as on the falling edge of the clock signal.

The data inputs of the first and third latches 108, 112 are configured to receive a statically configured data input, which may have a logical state of logical one or logical zero depending on convention. In the debounce circuit 100 of FIG. 1, the data inputs of the first and third latches 108, 112 are a logical one, however, in alternative embodiments, the data inputs may be a logical zero. The reset inputs of the latches 108, 110 are active low and the reset inputs of the latches 112, 114 are active high.

The operation of the debounce circuit 100 is first described during stable conditions when the input signal does not experience a glitch that causes it to transition (for example, momentarily) between states. During stable conditions, when the input signal is a logical one, the first reset synchronizer 102 is not reset, whereas the second reset synchronizer 104 is reset by the input signal. Accordingly, the first reset synchronizer 102 outputs a first signal (denoted '$S_1$') that is a logical one. Meanwhile, because the second reset synchronizer 104 is reset, the second reset synchronizer 104 outputs a second signal (denoted '$S_2$') that is a logical zero. Conversely, when the input signal is a logical zero, the first reset synchronizer 102 is reset and the first signal is logical zero, whereas the second reset synchronizer 104 is not reset and the second signal is a logical one.

Accordingly, during stable conditions, the first and second signals $S_1$, $S_2$ are indicative of the input signal with one of the signals being a logical one and the other signal being a logical zero. When the first signal $S_1$ is a logical one and the second signal $S_2$ is a logical zero, the synchronizers 102, 104 convey that the input signal is a logical one. Conversely, when the first signal is a logical zero and the second signal is a logical one, the synchronizers 102, 104 convey that the input signal is a logical zero.

The AND gate 116 receives the first and second signals and, during stable conditions, outputs a signal having a state that matches the state of the input signal. Due to the inversion of the second input of the AND gate 116, the signal output by the AND gate 116 is a logical one when the first signal is a logical one and the second signal is a logical zero. The signal output by the AND gate 116 is a logical zero when the first signal is a logical zero and the second signal is a logical one.

During stable conditions and in the absence of a glitch in the input signal, the OR gate 118 outputs a logical one, to the selection input of the multiplexer 120, thereby selecting the second data input of the multiplexer 120. The glitch track signal taken at the output of the OR gate 118 is a logical one and does not indicate the presence of a glitch.

The multiplexer 120 receives, at the second data input, the output signal of the AND gate 116. The output signal of the AND gate 116 is delayed by the buffer 119 to allow the output signal of the AND gate 116 to arrive at the multiplexer 120 after the output signal of the OR gate. The multiplexer 120 receives the logical one of the glitch track signal at the selection input commanding the multiplexer 120 to select the signal presented at the second data input. The multiplexer 120 outputs the output signal of the AND gate 116. As described herein, the output signal of the AND gate 116 matches the input signal during stable conditions. The output latch 122 receives the signal output by the multiplexer 120 and, at a subsequent rising edge of the clock signal, provides an output signal that matches the state of the received signal. Thus, during stable conditions and in steady-state, the output signal of the debounce circuit 100 matches the input signal of the debounce circuit 100.

The operation of the debounce circuit 100 is now described when the input signal experiences a glitch that causes it to transition between states. When a glitch occurs in the input signal, the input signal momentarily transitions to the opposite or complementary state. The synchronizers 102, 104 signal the occurrence of the glitch to the logic circuit 106. Whereas during stable conditions one of the synchronizers 102, 104 outputs a logical one and the other of the synchronizers 102, 104 outputs a logical zero, when a glitch occurs both synchronizers 102, 104 output a logical zero.

When the input signal initially has a logical one state, the first synchronizer 102 outputs a logical one and the second synchronizer 104 is reset and outputs a logical zero. When the glitch occurs and the input signal transitions to a logical zero, the first synchronizer 102 is reset in response. The first synchronizer 102 outputs a logical zero. Due to the fact that the synchronizers 102, 104 each have two cascaded latches, the outputs of the synchronizers 102, 104 remain at a logical zero for at least one clock cycle. For the first synchronizer 102 to transition from a logical zero to a logical one, two rising edges are required; a first rising edge of the clock signal to pass the logical one from the data input of the first latch 108 to the data input of the second latch 110 and a second rising edge to pass the logical one from the data input of the second latch 110 to the output of the first synchronizer 102. The cascading of the latches 108, 110 in the first synchronizer 102 and the latches 112, 114 in the second synchronizer 104 ensures that the first and second synchronizers 102, 104 each output a logical zero until at least two rising edges of the clock signal are observed when a glitch occurs.

When the first and second synchronizers 102, 104 both output logical zeros, the output of the OR gate 118 becomes a logical zero. Thus, the multiplexer 120 no longer selects and outputs the output of the AND gate 116. The multiplexer 120 instead outputs the signal presented at the first data input of the multiplexer 120. As described herein, the signal presented at the first data input is the present output signal that is fed back from the output latch 122. Accordingly, the multiplexer 120 recycles the output signal of the debounce circuit 100 and in effect locks the output signal of the debounce circuit 100 to its present state masking the glitch. Thus, the glitch in the input signal is not passed to the output signal.

When a glitch occurs, the multiplexer 120 bypasses the output of the AND gate 116. The multiplexer 120 no longer relies on the output of the AND gate 116 and, thus, the output signals of the synchronizers 102 for determining or conveying the state of the input signal. The debounce circuit 100 maintains the output signal at its present state when a glitch is detected.

The debounce circuit 100 exits glitch detection operations when the input signal remains in the same state for two rising edges of the clock signal. In response to the input signal remaining in the same state for two rising edges of the clock signal, the synchronizers 102, 104 revert to outputting complementary states. When the first and second signals ($S_1$, $S_2$) have complementary states, the output of the AND gate 116 conveys the input signal. It is noted that the output of the AND gate 116 conveys the state of the input signal with a delay of at least one clock cycle due to the cascading of the edge-triggered latches. Further, the output of the OR gate 118 is a logical one. The logical one output causes the multiplexer 120 to select and output the output of the AND gate 116, which represents the state of the input signal. The output latch 122 receives the output of the AND gate 116 and after one rising edge of the clock signal (e.g., one clock cycle), sets the state of the output signal to the state of the input signal.

In the debounce circuit 100, the synchronizers 102, 104 operate to respectively output the first and second signals ($S_1$, $S_2$) having complementary states when a glitch is not detected. The synchronizers 102, 104 output the first and second signals ($S_1$, $S_2$) having the same state of a logical zero (or a logical one depending on convention or use of a set input of the latches 108, 110, 112, 114) when a glitch is detected. The synchronizers 102, 104 continue to output logical zeros for at least one clock cycle when the glitch is detected.

The AND gate 116 decodes a state of the input signal from the first and second signals ($S_1$, $S_2$) when the first and second signals ($S_1$, $S_2$) have complementary states. The AND gate 116 outputs a signal having the same state as the input signal based on the states of the first and second signals ($S_1$, $S_2$).

The OR gate 118 decodes whether the synchronizers 102, 104 detect a glitch based on the first and second signals ($S_1$, $S_2$). The OR gate 118 outputs a signal indicating whether the glitch has been detected by the synchronizers 102, 104.

The buffer 119 delays the output signal of the AND gate 116 and renders the path between the OR gate 118 and the multiplexer 120 faster than the path between the AND gate 116 and the multiplexer 120. The buffer 119 operates to ensure that a selection signal provided by the OR gate 118 arrives at the multiplexer 120 prior to a corresponding data signal provided by the AND gate 116. It is noted that in an embodiment, use of the buffer 119 may be forgone in favor of employing a faster path between the output of the OR gate 118 and the multiplexer 120 than the path between the AND gate 116 and the multiplexer 120.

The multiplexer 120 receives the outputs of the AND gate 116 and OR gate 118 as well as the output signal of the debounce circuit 100. The multiplexer 120 operates to pass the state of the input signal, as decoded from the output of the synchronizers 102, 104, when the multiplexer 120 receives an indication that a glitch has not been detected. The multiplexer 120 operates to lock or recycle the present output signal of the latch 122 when the multiplexer 120 receives an indication that a glitch has been detected. The output latch 122 operates to store the output signal for one clock cycle for use by the multiplexer 120 in locking or recycling the present output signal.

Figure 2A:
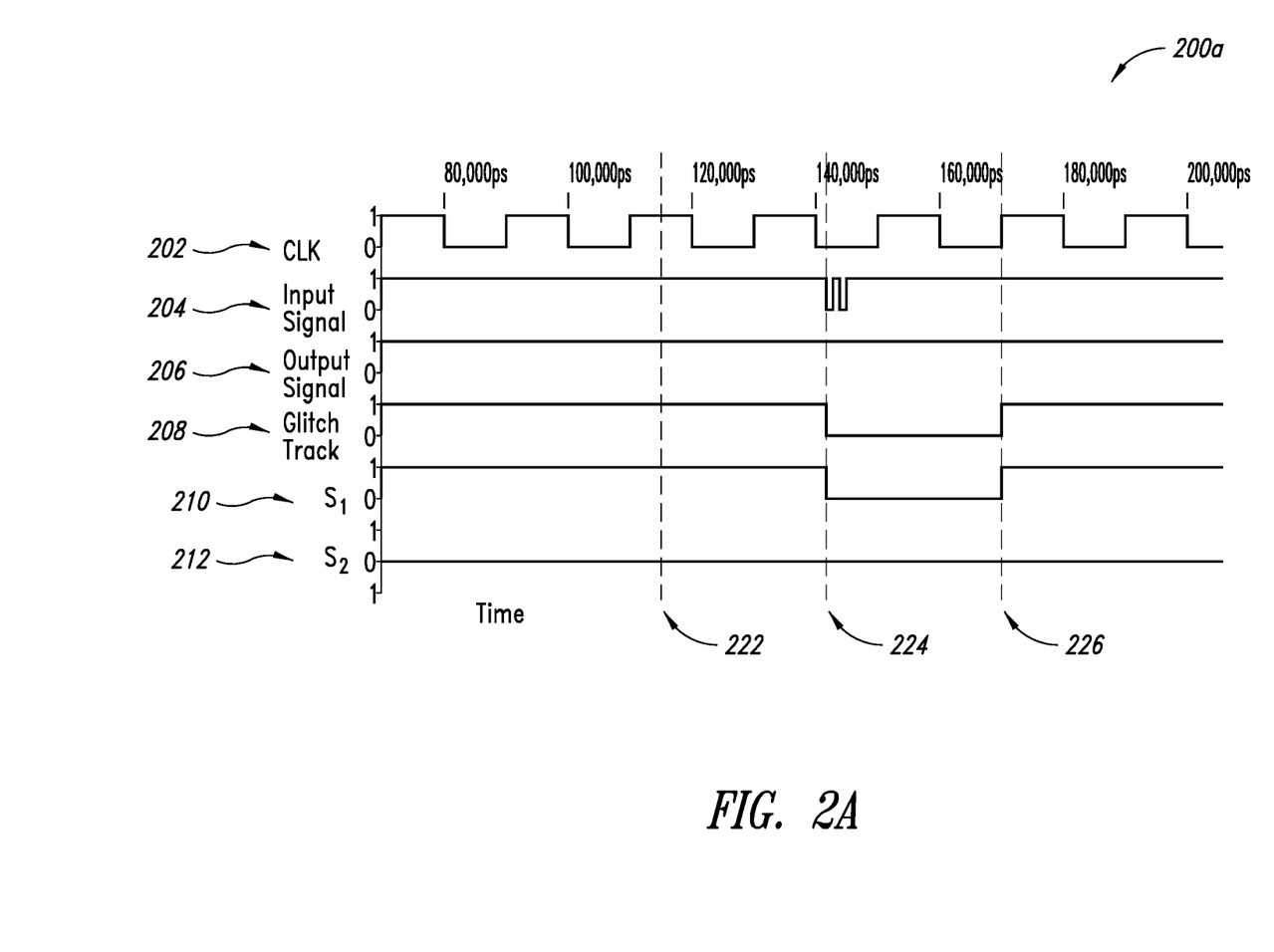
FIG. 2A shows a timing diagram for signals of the debounce circuit.

FIG. 2A shows a timing diagram 200a for signals of the debounce circuit 100. The clock signal 202, the input signal 204, the output signal 206, the glitch track signal 208, the first signal $S_1$ 210 and the second signal $S_2$ 212 are illustrated in the timing diagram 200a.

In a first timing diagram 200a, at a first time instance 222, the input signal 204 is a logical one. Correspondingly, the first signal 210 is a logical one and the second signal 212 is a logical zero. The states of the first and second signals 210, 212 convey the state of the input signal. At a second time instance 224, a glitch occurs and the first signal 210 transitions to a logical zero and fluctuates between states. As a result, the first signal 210 transitions to a logical zero. The glitch track signal also transitions to a logical zero indicating the occurrence of the glitch. As described herein, in response to the glitch at the second time instance 224, the states of the first and second signals 210, 212 (both logical zeros) indicate the presence of the glitch. The output signal 206 of the debounce circuit 100 is lock at its present state of a logical one. The glitch is ignored and does not pass from the input signal 204 to the output signal 206.

The first signal 210 remains at logical zero until a third time instance 226. At the third time instance 226, two rising edges of the clock signal 202 (at least one clock cycle) are observed from the occurrence of the glitch. At the third time instance 226, the first signal 210 transitions back to a logical one.

In addition, the glitch track signal 208 transitions back to a logical one at the third time instance 226 thereby indicating that the glitch in the input signal 206 has ended. The number of glitches occurring may be counted by counting the number of times that the glitch track signal 208 becomes low or assumes a logical state of zero.

Figure 2B:
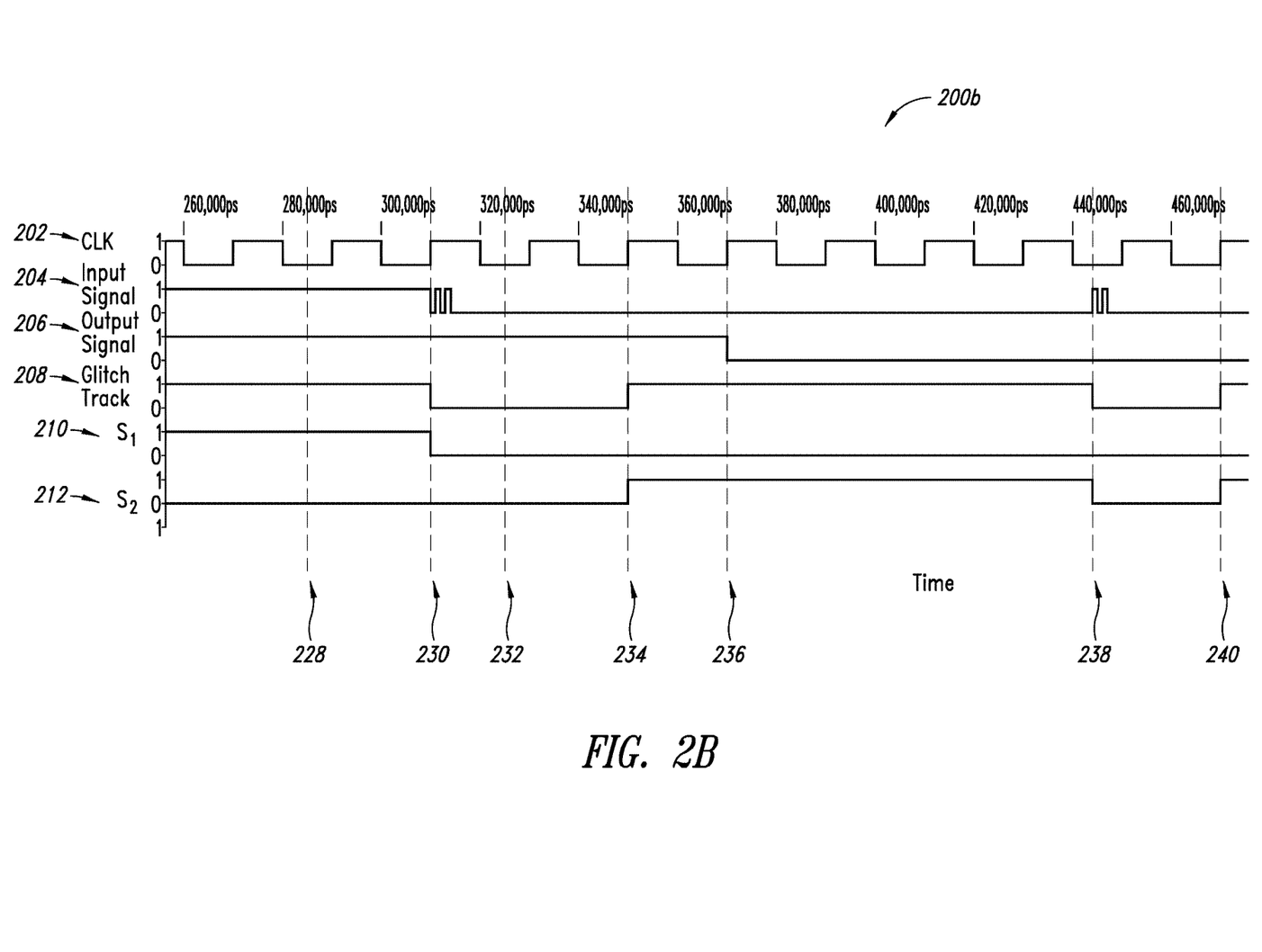
FIG. 2B shows a timing diagram for signals of the debounce circuit.

FIG. 2B shows a timing diagram 200b for signals of the debounce circuit 100. Initially at a first time instance 228, the input signal 204 is a logical one. Correspondingly the first signal 210 is a logical one and the second signal 212 is a logical zero. The output signal 206 is also a logical one.

At a second time instance 230, the input signal 204 transitions from a logical one to a logical zero and a first glitch occurs shortly thereafter causing the input signal 204 to transition between the two states. The transition causes the first signal 210 to transition to a logical zero and the first glitch causes the second signal 210 to remain at a logical zero for at least one clock cycle. The two states of the first and second signals 210, 212 indicate the occurrence of the glitch. The glitch track signal 208 transitions to a logical zero. The debounce circuit output signal 206 remains at its previous state prior to the occurrence of the first glitch.

The first signal 210 transitions to a logical zero immediately after the input signal 204 transitions from a logical one to a logical zero due to the fact that the latches 108, 110 of the first reset synchronizer 102, whose reset inputs are active low, are reset by the input signal. Meanwhile, the latches 112, 114 of the second reset synchronizer 104 are no longer reset. However, due to the cascading of the latches 112, 114, two rising edges of the clock signal 202 are needed for the static one provided at the data input of the third latch 112 to propagate to the data output of the fourth latch 114 as the second signal 212.

It is noted that use of the two cascaded latches in each reset synchronizer 102, 104 ensures that, when a glitch occurs, there is at least one clock cycle during which the first and second signals 210, 212 are both low. Conversely, if one latch instead of two were used in each reset synchronizer 102, 104, then a glitch coinciding with the rising edge of the clock signal 202 may not be filtered and may be mistaken for a signal transition. This glitch coinciding with the rising edge of the clock signal 202 would then propagate to the output of the reset synchronizers 102, 104 and, consequently, the output signal 206 of the debounce circuit 100.

Similarly, use of three cascaded latches results in a need for three rising edges of the clock signal 202 rather than two (or at least two full clock cycles rather than one) for the first and second output signals 210, 212 to revert to complementary states after the occurrence of the glitch.

After the transition having the first glitch, the input signal 204 settles in the logical zero state. For example, at a third time instance 232, the input signal 204 is in the logical zero state. However, due to the prior occurrence of the first flitch, the output signal 206 is a logical one.

After two rising edges of the clock signal 202 from the first glitch, at a fourth time instance 234, the second signal 212 transitions to a logical one and the first signal 210 remains at the logical zero. The states of the first and second signals 210, 212 (complementary states of zero and one, respectively) now indicate that no glitch is detected and that the input signal 204 has a state of logical zero.

In response, the output signal 206 transitions to the corresponding state of the input signal 204 (a logical zero) after one clock cycle at a fifth time instance 236. The transition occurs after one rising edge of the clock signal 202 due to the one clock cycle delay of the output latch 122.

At a sixth time instance 238, a second glitch occurs in the input signal 204. In response, the second signal 212 transitions to a logical zero. Thereby, the first and second signals 210, 212 collectively indicate the present of the second glitch. The glitch track signal 208 transitions to a logical zero indicating detection of the second glitch. The debounce circuit 100 keeps the output signal 204 at its state of logical zero prior to the occurrence of the second glitch and the second glitch does not propagate in the output signal 206.

At a seventh time instance 240 occurring two rising edges of the clock signal 202 subsequent to the second glitch, the second signal 212 and the glitch track signal 208 both transition back to a logical one. The output signal 206 of the debounce circuit remains at a logical zero between the sixth and seventh time instances 238, 240. The second glitch does not affect the output signal 206.

Figure 3:
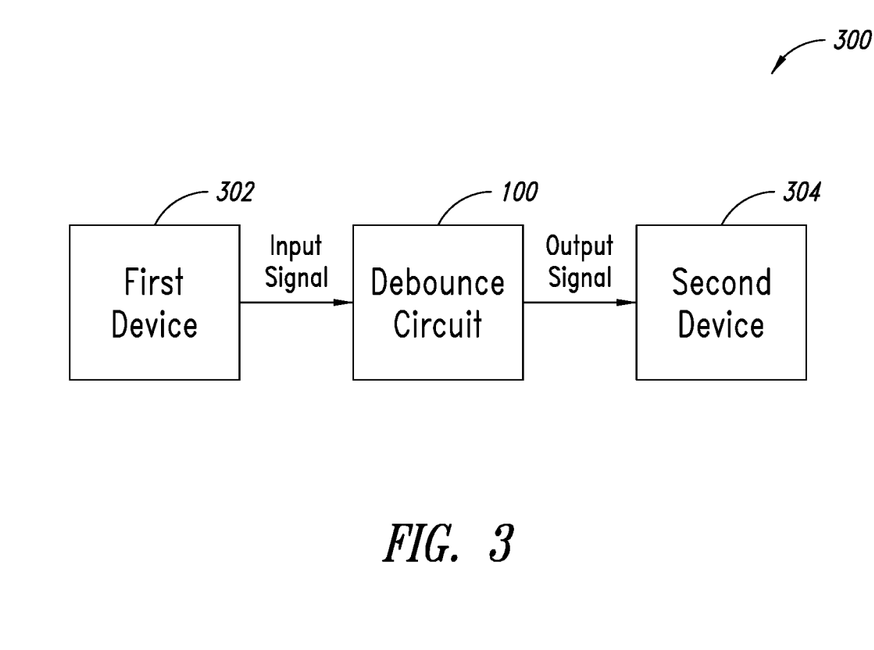
FIG. 3 shows a block diagram of a system including the debounce circuit.

FIG. 3 shows a block diagram of a system 300 including the debounce circuit 100. The system 300 includes first and second devices 302, 304 and the debounce circuit 100. The first device 302 has an output coupled to an input of the debounce circuit 100 (or reset synchronizer circuit 101 thereof). The first device 302 sends the input signal to the debounce circuit 100. The second device 304 has an input coupled to an output of the debounce circuit 100 (or logic circuit 106 thereof). The second device 304 receives the output signal from the debounce circuit 100.

The debounce circuit 100 receives the input signal from the first device 302 and outputs the output signal to the second device 304. The input signal may include a glitch as described herein. The debounce circuit 100 masks the glitch and outputs the output signal as a glitch-free signal to the second device 304.

The first and second devices 302, 304 may each be a processor, controller, microcontroller, system-on-chip or memory device, such as a random access memory (RAM), or an element, device or component thereof. The debounce circuit 100 may be used to mitigate noise, glitches, or transient variations in signals of the system 300, which may result from mechanical bounce occurring at a change of signal state and ambient electrical noise of the system 300. The debounce circuit 100 performs robust filtering of electrical noise while having reduced logic and minimal overhead on the system 300.

Figure 4:
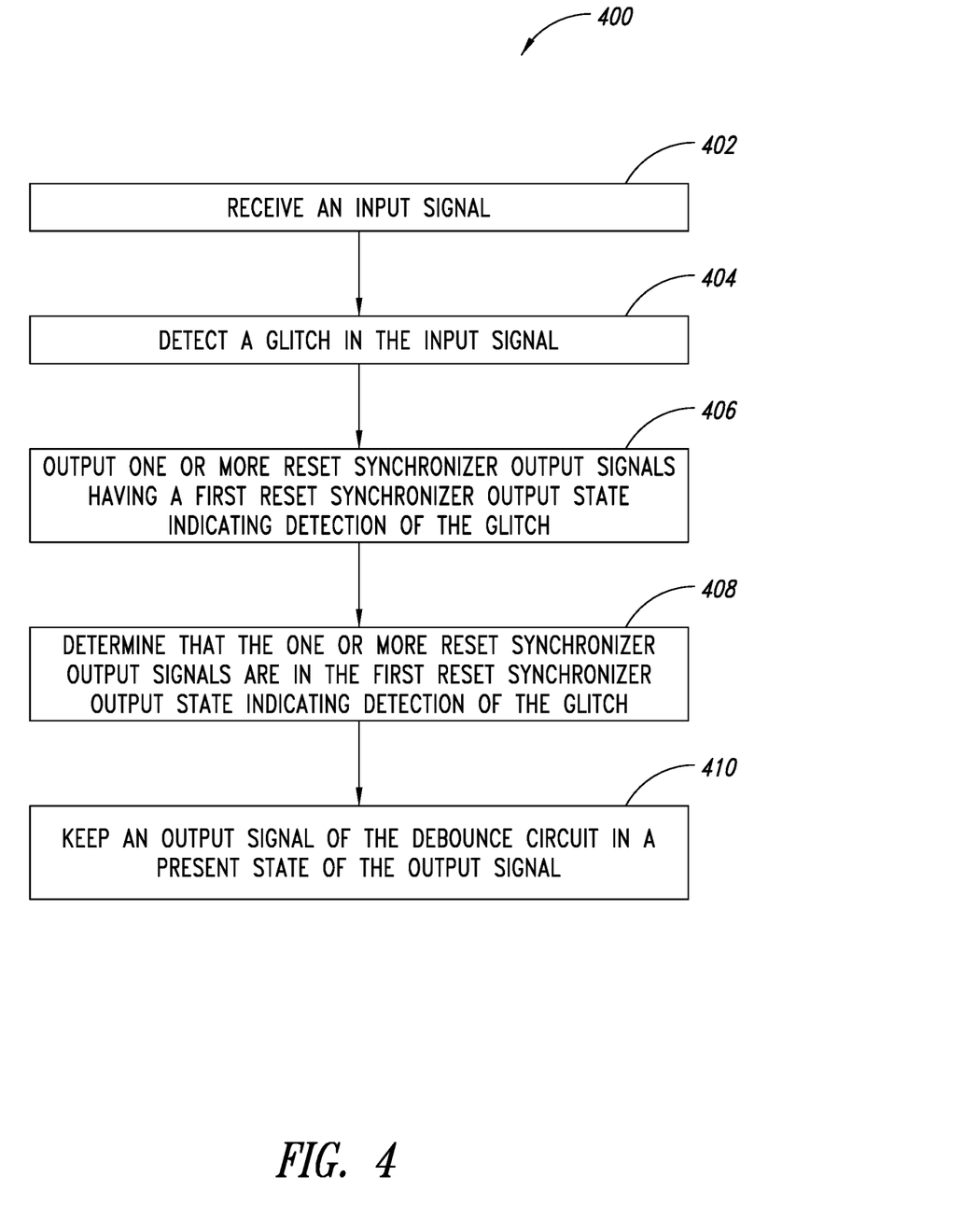
FIG. 4 shows a flow diagram of a method for mitigating a glitch.

FIG. 4 shows a flow diagram of a method 400 for mitigating a glitch. In the method 400, a reset synchronizer circuit of a debounce circuit receives an input signal at 402. At 404, the reset synchronizer circuit detects a glitch in the input signal. In response to detecting the glitch in the input signal, the reset synchronizer circuit, at 406, outputs one or more reset synchronizer output signals having a first reset synchronizer output state indicating detection of the glitch.

At 408, the logic circuit determines that the one or more reset synchronizer output signals are in the first reset synchronizer output state indicating detection of the glitch. In response to determining that the one or more reset synchronizer output signals are in the first reset synchronizer output state, the logic circuit keeps an output signal of the debounce circuit in a present state of the output signal at 410.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A debounce circuit, comprising:
   a reset synchronizer circuit configured to:
      receive an input signal;
      detect a glitch in the input signal; and
      in response to detecting the glitch in the input signal, output one or more reset synchronizer signals having a first reset synchronizer state indicating detection of the glitch; and
   a logic circuit configured to:
      receive the one or more reset synchronizer signals;
      determine that the one or more reset synchronizer signals are in the first reset synchronizer state indicating detection of the glitch; and
      in response to determining that the one or more reset synchronizer signals are in the first reset synchronizer state, keep an output signal of the debounce circuit in a present state of the output signal of the debounce circuit.

2. The debounce circuit according to claim 1, wherein the reset synchronizer circuit is configured to:
   determine that the input signal does not include the glitch; and
   in response to determining that the input signal does not include the glitch,
      when the input signal is in a first state, output the one or more reset synchronizer output signals having a second reset synchronizer state indicating that the glitch is not detected and the input signal is in the first state; and
      when the input signal is in a second state, output the one or more reset synchronizer output signals having a third reset synchronizer state indicating that the glitch is not detected and the input signal is in the second state.

3. The debounce circuit according to claim 2, wherein the logic circuit is configured to:
   determine that the one or more reset synchronizer output signals are in the second reset synchronizer state; and
   in response to determining that the one or more reset synchronizer output signals are in the second reset synchronizer state, output the output signal of the debounce circuit in the first state.

4. The debounce circuit according to claim 2, wherein the logic circuit is configured to:
   determine that the one or more reset synchronizer output signals are in the third reset synchronizer state; and
   in response to determining that the one or more reset synchronizer output signals are in the third reset synchronizer state, output the output signal of the debounce circuit in the second state.

5. The debounce circuit according to claim 1, wherein the reset synchronizer circuit includes:
   a first reset synchronizer having a reset input that is active low and that is configured to receive the input signal; and
   a second reset synchronizer having a reset input that is active high and that is configured to receive the input signal.

6. The debounce circuit according to claim 5, wherein:
   the first reset synchronizer includes first and second latches that are cascaded, wherein the first and second latches each have a reset input that is active low and that is configured to receive the input signal; and
   the second reset synchronizer includes third and fourth that are cascaded, wherein the third and fourth latches each have a reset input that is active high and that is configured to receive the input signal.

7. The debounce circuit according to claim 6, wherein:
   the first latch has a data input configured to receive a first state, a clock input configured to receive a clock signal and a data output; and
   the second latch has a data input coupled to the data output of the first latch, a clock input configured to receive the clock signal and a data output configured to provide a first reset synchronizer output signal of the one or more reset synchronizer output signals;
   the third latch has a data input configured to receive the first state, a clock input configured to receive the clock signal and a data output; and
   the fourth latch has a data input coupled to the data output of the third latch, a clock input configured to receive the clock signal and a data output configured to provide a second reset synchronizer output signal of the one or more reset synchronizer output signals.

8. The debounce circuit according to claim 1, wherein the logic circuit includes:
   an AND gate having a first input configured to receive a first reset synchronizer output signal of the one or more reset synchronizer output signals, a second input that is an inverting input configured to receive a second reset synchronizer output signal of the one or more reset synchronizer output signals and an output configured to provide a determined state of the input signal, based on the first and second reset synchronizer output signals, when the glitch is not detected; and
   an OR gate having a first input configured to receive the first reset synchronizer output signal, a second input configured to receive the second reset synchronizer output signal and an output configured to provide an indication of whether the glitch is detected based on the first and second reset synchronizer output signals.

9. The debounce circuit according to claim 8, wherein the logic circuit includes:
   a multiplexer having a first data input configured to receive the present state of the output signal, a second data input coupled to the output of the AND gate, a selection input coupled to the output of the OR gate and an output, wherein the multiplexer is operative to:
   output, over the output of the multiplexer, the determined state of the input signal when the glitch is not detected; and
   output, over the output of the multiplexer, the present state of the output signal when the glitch is detected.

10. The debounce circuit according to claim 9, wherein the logic circuit includes:
    an output latch having a data input coupled to the output of the multiplexer, a clock input configured to receive a clock signal, a data output configured to output the output signal and a reset input configured to receive a system reset signal, the output latch being operative to store the present state of the output signal for providing to the multiplexer.

11. A method, comprising:
    receiving, by a reset synchronizer circuit, an input signal;
    detecting, by the reset synchronizer circuit, a glitch in the input signal;
    in response to detecting the glitch in the input signal, outputting, by the reset synchronizer circuit, one or more reset synchronizer output signals having a first reset synchronizer state of a plurality of reset synchronizer states indicating detection of the glitch;
    determining, by a logic circuit, that the one or more reset synchronizer output signals are in the first reset synchronizer state indicating detection of the glitch; and
    in response to determining that the one or more reset synchronizer output signals are in the first reset synchronizer state, keeping, by the logic circuit, an output signal of the debounce circuit in a present state of the output signal.

12. The method according to claim 11, comprising:
    determining, by the reset synchronizer circuit, that the input signal does not include the glitch; and
    in response to determining that the input signal does not include the glitch,
       when the input signal is in a first state, outputting, by the reset synchronizer circuit, the one or more reset synchronizer output signals having a second reset synchronizer state of the plurality of reset synchronizer states indicating that the glitch is not detected and the input signal is in the first state; and
       when the input signal is in a second state, outputting, by the reset synchronizer circuit, the one or more reset synchronizer output signals having a third reset synchronizer state of the plurality of reset synchronizer states indicating that the glitch is not detected and the input signal is in the second state.

13. The method according to claim 12, comprising:
    determining, by the logic circuit, that the one or more reset synchronizer output signals are in the second reset synchronizer state; and
    in response to determining that the one or more reset synchronizer output signals are in the second reset synchronizer state, outputting, by the logic circuit, the output signal of the debounce circuit in the first state.

14. The method according to claim 12, comprising:
    determining, by the logic circuit, that the one or more reset synchronizer output signals are in the third reset synchronizer state; and
    in response to determining that the one or more reset synchronizer output signals are in the third reset synchronizer state, outputting, by the logic circuit, the output signal of the debounce circuit in the second state.

15. A system, comprising:
a first device configured to send an input signal;
a debounce circuit, coupled to the first device, and including:
  a reset synchronizer circuit configured to:
    receive the input signal;
    detect a glitch in the input signal; and
    in response to detecting the glitch in the input signal, output one or more reset synchronizer output signals having a first reset synchronizer state indicating detection of the glitch; and
  a logic circuit configured to:
    receive the one or more reset synchronizer output signals;
    determine that the one or more reset synchronizer output signals are in the first reset synchronizer state indicating detection of the glitch; and
    in response to determining that the one or more reset synchronizer output signals are in the first reset synchronizer state, keep an output signal of the debounce circuit in a present state of the output signal; and
a second device, coupled to the debounce circuit, configured to receive the output signal.

16. The system according to claim 15, wherein the reset synchronizer circuit is configured to:
determine that the input signal does not include the glitch; and
in response to determining that the input signal does not include the glitch,
  when the input signal is in a first state, output the one or more reset synchronizer output signals having a second reset synchronizer state indicating that the glitch is not detected and the input signal is in the first state; and
  when the input signal is in a second state, output the one or more reset synchronizer output signals having a third reset synchronizer state indicating that the glitch is not detected and the input signal is in the second state.

17. The system according to claim 16, wherein the logic circuit is configured to:
determine that the one or more reset synchronizer output signals are in the second reset synchronizer state; and
in response to determining that the one or more reset synchronizer output signals are in the second reset synchronizer state, output the output signal of the debounce circuit in the first state.

18. The system according to claim 16, wherein the logic circuit is configured to:
determine that the one or more reset synchronizer output signals are in the third reset synchronizer state; and
in response to determining that the one or more reset synchronizer output signals are in the third reset synchronizer state, output the output signal of the debounce circuit in the second state.

19. The system according to claim 15, wherein the reset synchronizer circuit includes:
a first reset synchronizer including
  a first latch having a data input configured to receive a first state, a clock input configured to receive a clock signal, a data output and an inverting reset input configured to receive the input signal; and
  a second latch having a data input coupled to the data output of the first latch, a clock input configured to receive the clock signal, a data output configured to provide a first reset synchronizer output signal of the one or more reset synchronizer output signals and an inverting reset input configured to receive the input signal; and
a second reset synchronizer including
  a third latch having a data input configured to receive the first state, a clock input configured to receive the clock signal, a data output and a non-inverting reset input configured to receive the input signal; and
  a fourth latch having a data input coupled to the data output of the third latch, a clock input configured to receive the clock signal, a data output configured to provide a second reset synchronizer output signal of the one or more reset synchronizer output signals and an non-inverting reset input configured to receive the input signal.

20. The system according to claim 15, wherein the logic circuit includes:
an AND gate having a first input configured to receive a first reset synchronizer output signal of the one or more reset synchronizer output signals, a second input that is an inverting input configured to receive a second reset synchronizer output signal of the one or more reset synchronizer output signals and an output configured to provide a determined state of the input signal, based on the first and second reset synchronizer output signals, when the glitch is not detected; and
an OR gate having a first input configured to receive the first reset synchronizer output signal, a second input configured to receive the second reset synchronizer output signal and an output configured to provide an indication of whether the glitch is detected based on the first and second reset synchronizer output signals.

21. The system according to claim 20, wherein the logic circuit includes:
a multiplexer having a first data input configured to receive the present state of the output signal, a second data input coupled to the output of the AND gate, a selection input coupled to the output of the OR gate and an output, wherein the multiplexer is operative to:
output, over the output of the multiplexer, the determined state of the input signal when the glitch is not detected; and
output, over the output of the multiplexer, the present state of the output signal when the glitch is detected.

22. The system according to claim 21, wherein the logic circuit includes:
an output latch having a data input coupled to the output of the multiplexer, a clock input configured to receive a clock signal, a data output configured to output the output signal and a reset input configured to receive a system reset signal, the output latch being operative to store the present state of the output signal for providing to the multiplexer.

* * * * *